United States Patent
Lee et al.

(10) Patent No.: US 7,091,735 B2
(45) Date of Patent: Aug. 15, 2006

(54) TESTING PROBE AND TESTING JIG

(75) Inventors: Chung-Shan Lee, Taoyuan City (TW);
Hsu-Lin Ting, Changhua County (TW)

(73) Assignee: Asustek Computer Inc., Taipei (TW)

( * ) Notice: Subject to any disclaimer, the term of this patent is extended or adjusted under 35 U.S.C. 154(b) by 0 days.

(21) Appl. No.: 10/952,801

(22) Filed: Sep. 30, 2004

(65) Prior Publication Data
US 2005/0151556 A1      Jul. 14, 2005

(30) Foreign Application Priority Data
Jan. 8, 2004    (TW) .............................. 93100484 A

(51) Int. Cl.
*G01R 1/67*    (2006.01)
(52) U.S. Cl. ...................... 324/761; 324/754
(58) Field of Classification Search ...................... None
See application file for complete search history.

(56) References Cited

U.S. PATENT DOCUMENTS

| | | | | |
|---|---|---|---|---|
| 5,175,493 A | * | 12/1992 | Langgard | ...................... 324/761 |
| 6,053,777 A | * | 4/2000 | Boyle | .......................... 439/700 |

FOREIGN PATENT DOCUMENTS

JP          60/073468       *    4/1985

* cited by examiner

*Primary Examiner*—Ernest Karlsen
(74) *Attorney, Agent, or Firm*—Birch, Stewart, Kolasch and Birch, LLP

(57) ABSTRACT

A testing probe includes a first sleeve, a first springy component, a first movable rod, a second springy component, and at least one second movable rod. The first sleeve has a first containing portion, which is located inside the first containing portion. The first movable rod is partially inserted into the first containing portion, and has a first stopper portion and a second containing portion. The first stopper portion is located inside the first containing portion and contacts the first springy component, so that the first movable rod and first containing portion are capable of relatively sliding. The second springy component is located inside the second containing portion. The second movable rod is partially inserted into the second containing portion, and has a second stopper portion. The second stopper portion is located inside the second containing portion and contacts the second springy component, so that the second movable rod and second containing portion are capable of relatively sliding.

17 Claims, 6 Drawing Sheets

TESTING PROBE AND TESTING JIG

This Non-provisional application claims priority under 35 U.S.C. § 119(a) on patent application No(s). 093100484 filed in Taiwan, Republic of China on Jan. 8, 2004, the entire contents of which are hereby incorporated by reference.

BACKGROUND OF THE INVENTION

1. Field of Invention

The invention relates to a testing probe and a testing jig, and more particularly to a testing probe and a testing jig for testing an electrolytic capacitor.

2. Related Art

An electrical product is usually constituted by several small electronic elements, wherein the electrolytic capacitor is a small electronic element that is often seen. After the electrical product has been assembled, it has to be tested in a series of testing processes, such as electrical tests and functional tests. Taking the testing of the electrolytic capacitor as an example, the assembled electrolytic capacitor usually has to be tested in order to judge whether or not the problems, such as specification error, polarity inversion, and lack of elements, occur.

Referring to FIG. 1, a testing system includes a circuit board 11, an electrolytic capacitor 13 located on the circuit board 11, and a testing jig 20. The testing jig 20 includes a base 21 and a testing probe 23. In the prior art, the testing probe 23 is uncompressible. Thus, when the conventional testing probe 23 is utilized to test the electrolytic capacitor 13, the testing probe 23 tends to be broken or bent owing to the improperly applied force. As a result, the correctness of the testing result is influenced, and the lifetime of the testing jig 20 is thus shortened.

In order to solve the problems of the tendency of breaking or bending of the conventional testing probe, another testing probe 30 has been proposed, as shown in FIG. 2. The testing probe 30 includes a sleeve 31, a spring 33, and a movable rod 35. The sleeve 31 has a containing portion 311 and at least one neck 313. The spring 33 is located inside the containing portion 311. One end of the movable rod 35 is an arresting end portion 351 located inside the containing portion 311 and between the neck 313 and the spring 33. As shown in FIG. 2, the movable rod 35 and sleeve 31 may slide relatively and thus provide a probe stroke. Accordingly, when the testing probe 30 is utilized to test the electrolytic capacitor, the probe stroke may serve as the means for buffering the sustained stress of the testing probe 30, so as to avoid the break or bend owing to the improperly applied force. The probe stroke may be defined as the movable distance between the testing probe 30 and the contact portion (i.e., the other end of the movable rod 35) of the to-be-tested electrolytic capacitor.

However, the conventional testing probe 30 only utilizes the neck 313 to hold the arresting end portion 351 within the containing portion 311. In this case, when the ratio of the length (i.e., the probe stroke) of the movable rod 35, which is exposed to the outside of the containing portion 311, to the diameter of the neck 313 is too large, the testing probe 30 tends to be broken or bent at the neck 313, as shown in FIG. 3. Thus, the maximum probe stroke that can be provided by the conventional testing probe 30 is restricted.

Consequently, it is an important subjective in manufacturing electrical products to provide a testing probe, which may provide a longer probe stroke and have better probe intensity, and a testing jig using the same.

SUMMARY OF THE INVENTION

In view of the above-mentioned problems, the invention is to provide a testing probe with an increased probe stroke and enhanced probe intensity.

Furthermore, the invention is to provide a testing jig using a testing probe with an increased probe stroke and enhanced probe intensity.

To achieve the above, the invention provides a testing probe including a first sleeve, a first springy component, a first movable rod, a second springy component, and at least one second movable rod. In this invention, the first sleeve has a first containing portion, and the first springy component is located inside the first containing portion. The first movable rod is at least partially inserted into the first containing portion and has a first stopper portion and second containing portion. The first stopper portion is located inside the first containing portion and contacts the first springy component, so that first movable rod and the first containing portion are capable of relatively sliding. The second springy component is located inside the second containing portion. The second movable rod is at least partially inserted into the second containing portion and has a second stopper portion. The second stopper portion is located inside the second containing portion and contacts the second springy component, so that the second movable rod and the second containing portion are capable of relatively sliding.

In addition, the invention also provides a testing jig for testing an electrolytic capacitor. The testing jig includes a base and a testing probe as described above. In this invention, the testing probe is connected to the base.

As mentioned above, because the testing probe of the invention utilizes the first movable rod and the second movable rod to provide a two-stage probe stroke, the total probe stroke of the testing probe may be effectively increased. In addition, the testing probe of the invention distributes the sustained stress over the first movable rod and the second movable rod, so the intensity of the testing probe may be effectively enhanced. Furthermore, since the testing jig of the invention employs the above-mentioned testing probe, the total probe stroke may be increased in conjunction with different heights of the to-be-tested electrolytic capacitors. Thus, the probe intensity may be enhanced, so that the situations, such as the increased costs and error test results caused by the broken or bent testing probe, are prevented.

BRIEF DESCRIPTION OF THE DRAWINGS

The invention will become more fully understood from the detailed description given hereinbelow illustration only, and thus is not limitative of the present invention, and wherein.

DETAILED DESCRIPTION OF THE INVENTION

The invention will be described below with reference to relevant drawings, wherein the same elements are referred with the same reference numbers.

Figure 1:
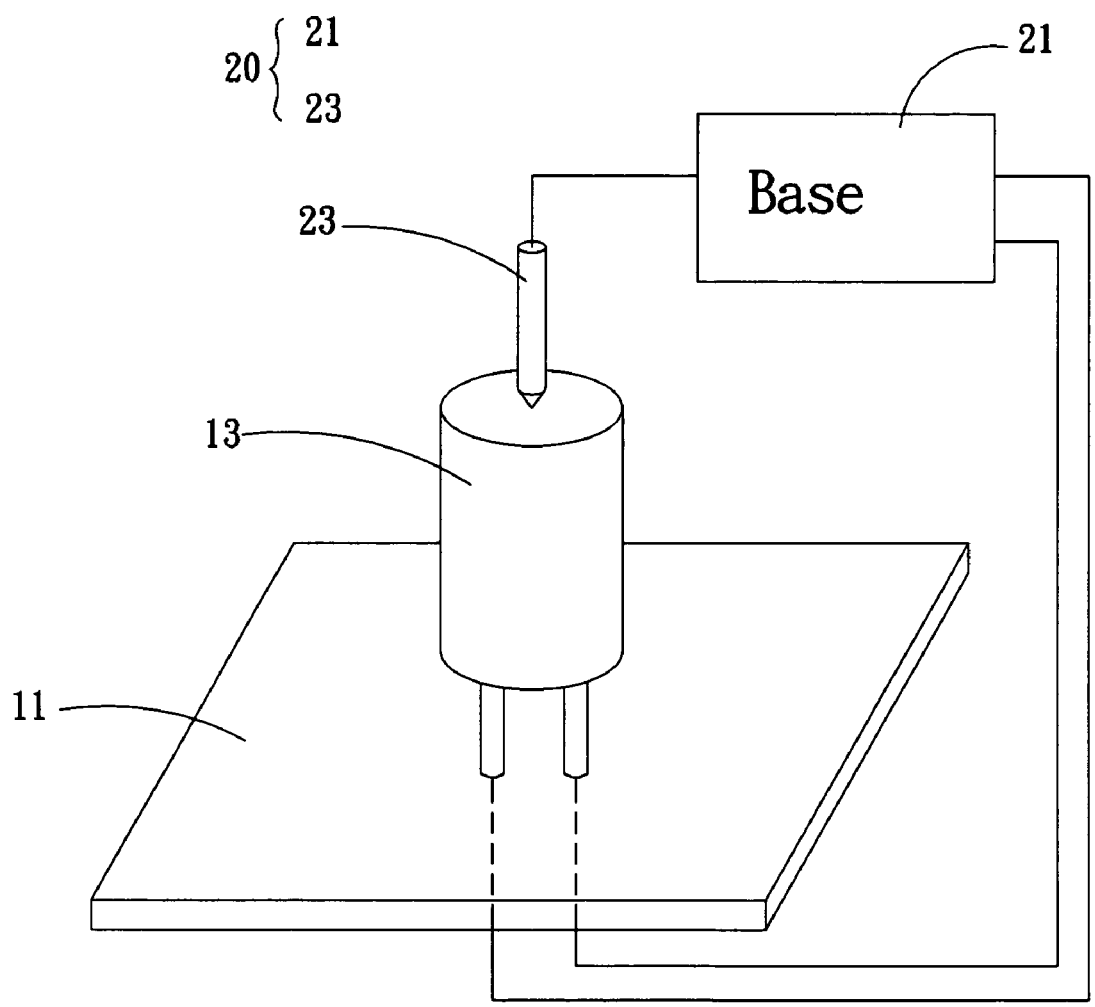
FIG. 1 is a schematic illustration showing a conventional electrolytic capacitor that is tested.
Figure 2:
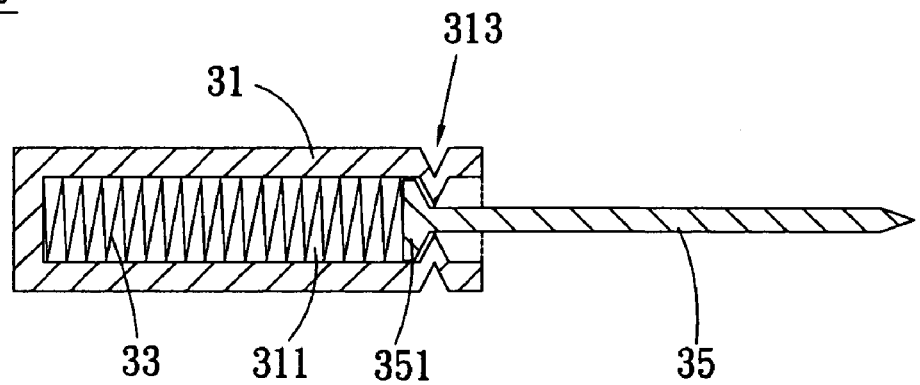
FIG. 2 is a schematically cross-sectional view showing a conventional testing probe.
Figure 3:
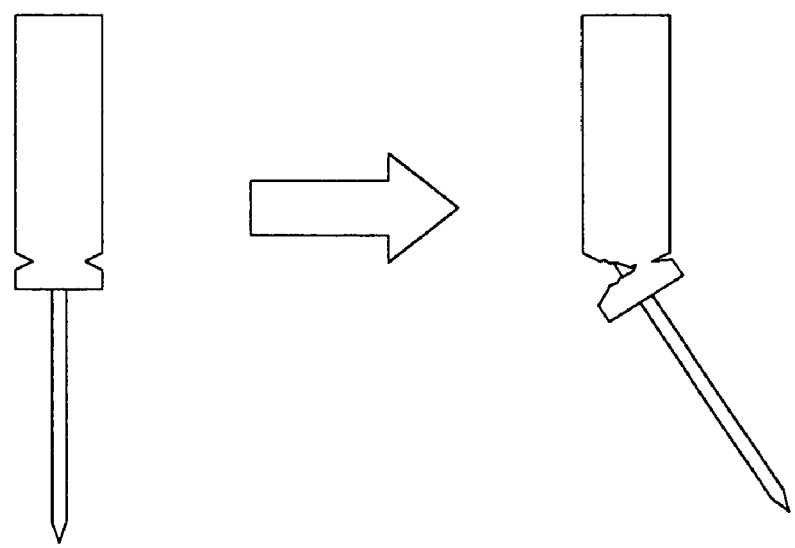
FIG. 3 is a schematic illustration showing the conventional testing probe, which is bent and deforms.
Figure 4A:
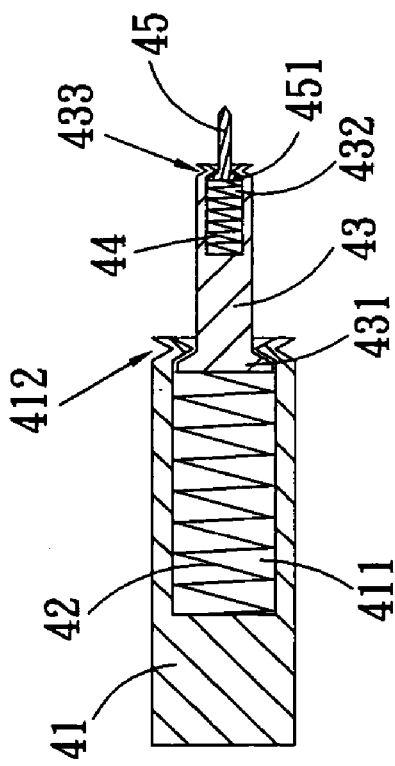
FIG. 4A is a schematically cross-sectional view showing a testing probe according to a preferred embodiment of the invention.
Figure 4B:
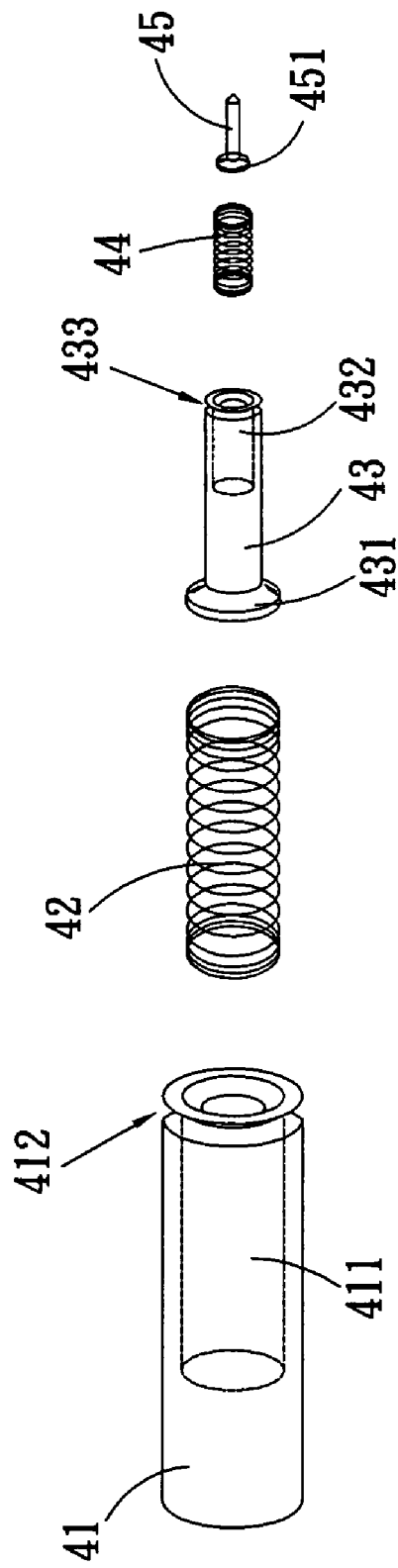
FIG. 4B is a schematically exploded view showing the testing probe of FIG. 4A.

Referring to FIGS. 4A and 4B, a testing probe 4 according to the preferred embodiment of the invention includes a first sleeve 41, a first springy component 42, a first movable rod 43, a second springy component 44, and at least one second movable rod 45.

The first sleeve 41 has a first containing portion 411. In this embodiment, the first containing portion 411 provides a space to contain the first springy component 42 and at least one part of the first movable rod 43. In addition, the first containing portion 411 further has a first neck 412.

The first springy component 42 is located inside the first containing portion 411. In the embodiment, the first springy component 42 may be any resilient member, such as a spring, which is capable of providing the linear displacement.

The first movable rod 43 has a first stopper portion 431 and a second containing portion 432, and at least one part of the first movable rod 43 is inserted into the first containing portion 411. The first stopper portion 431 is located inside the first containing portion 411 and contacts the first springy component 42. In this embodiment, the first stopper portion 431 is disposed between the first springy component 42 and the first neck 412, so that the first stopper portion 431 is restricted within the first containing portion 411. The first movable rod 43 and the first containing portion 411 are capable of relatively sliding, and the second containing portion 432 further has a second neck 433.

The second springy component 44 is located inside the second containing portion 432. In this embodiment, the second springy component 44 may be any resilient member, such as a spring, which is capable of providing the linear displacement. That is, the second springy component 44 may be similar to the first springy component 42 but the size of the second springy component 44 is smaller than the first springy component 42.

The second movable rod 45 has a second stopper portion 451, and at least one part of the second movable rod 45 is inserted into the second containing portion 432. The second stopper portion 451 is located inside the second containing portion 432 and contacts the second springy component 44. In this embodiment, the second stopper portion 451 is disposed between the second springy component 44 and the second neck 433, so that the second stopper portion 451 is restricted within the second containing portion 432. The second movable rod 45 and the second containing portion 432 are capable of relatively sliding. It is to be noted that the testing probe 4 according to the preferred embodiment of the invention may have a plurality of second movable rods (not shown), such as three or more than three second movable rods.

As mentioned above, the first movable rod 43 and the first containing portion 411 are capable of relatively sliding, and the second movable rod 45 and the second containing portion 432 are capable of relatively sliding. Thus, a two-stage probe stroke may be provided. In addition, the sustained external force of the overall testing probe 4 may be effectively distributed over the first movable rod 43 and the second movable rod 45. That is, the external force is dispersed and converted into the potentials of the first springy component 42 and the second springy component 44.

Figure 5A:
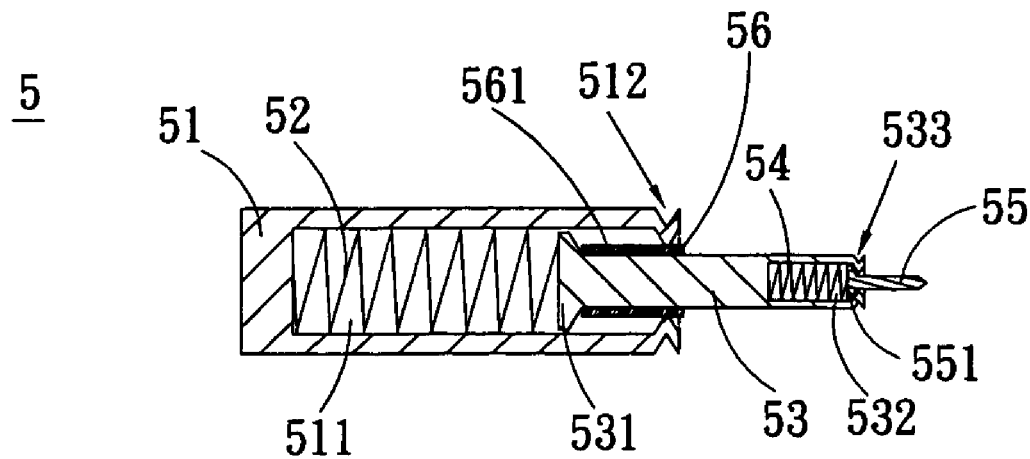
FIGS. 5A and 5B are schematically cross-sectional views showing the testing probe according to another preferred embodiment of the invention.
Figure 5B:
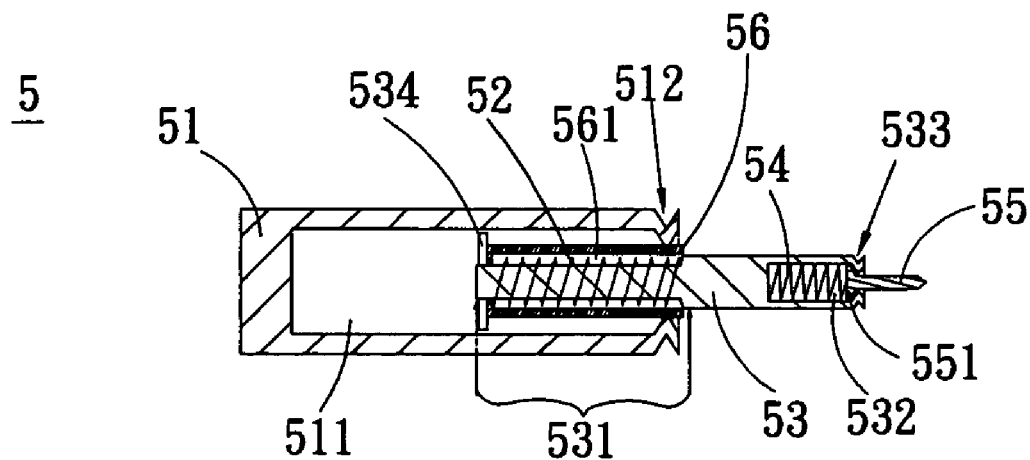

In addition, referring to FIGS. 5A and 5B, a testing probe 5 according to another preferred embodiment of the invention includes a first sleeve 51, a first springy component 52, a first movable rod 53, a second springy component 54, at least one second movable rod 55, and a second sleeve 56.

In this embodiment, the first sleeve 51 has a first containing portion 511 having a first neck 512. The first springy component 52 is located inside the first containing portion 511. The first movable rod 53 is at least partially inserted into the first containing portion 511 and has a first stopper portion 531 and a second containing portion 532. The first stopper portion 531 is located inside the first containing portion 511 and contacts the first springy component 52, so that first movable rod 53 and the first containing portion 511 are capable of relatively sliding. The second containing portion 532 further has a second neck 533. The second springy component 54 is located inside the second containing portion 532. At least one part of each second movable rod 55 is inserted into the second containing portion 532. Each second movable rod 55 has a second stopper portion 551, which is located inside the second containing portion 532 and contacts the second springy component 54. Therefore, the second movable rod 55 and the second containing portion 532 are capable of relatively sliding. The second sleeve 56 is inserted into and fixed to the first containing portion 511, and has a first through hole 561. The first movable rod 53 passes through the first through hole 561, and the first stopper portion 531 is fully or partially located outside the second sleeve 56. The second sleeve 56 is fixed to the inside of the first containing portion 511 through the first neck 512 of the first sleeve 51.

As shown in FIG. 5A, the first springy component 52 is located inside the first containing portion 511 and adjacent to the second sleeve 56. The first stopper portion 531 protrudes over the second sleeve 56 so as to contact the first springy component 52.

In addition, as shown in FIG. 5B, the first springy component 52 is located inside the first containing portion 511 and the first through hole 561. In this case, the first movable rod 53 further passes through the first springy component 52, and the first stopper portion 531 is partially located outside the second sleeve 56. A C-ring 534 located outside the second sleeve 56 is utilized to restrict one part of the first movable rod 53 in the second sleeve 56.

Figure 6A:
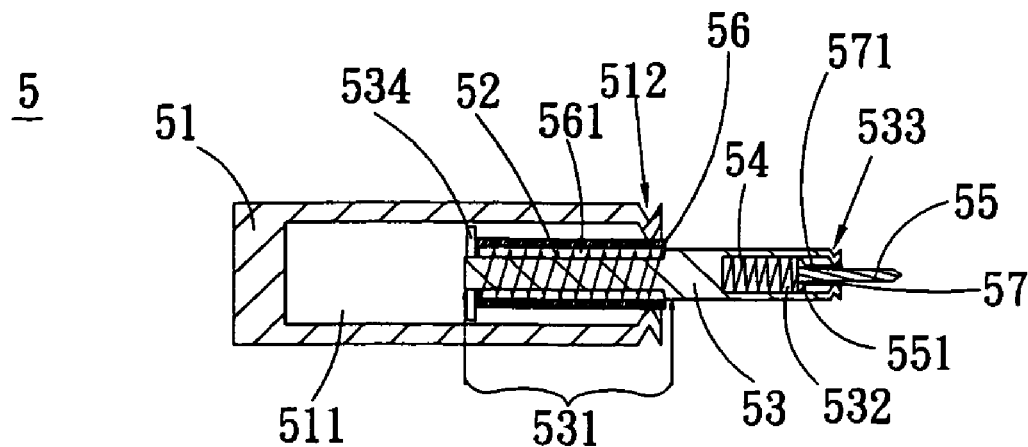
FIGS. 6A and 6B are schematically cross-sectional views showing the testing probe according to still another preferred embodiment of the invention.
Figure 6B:
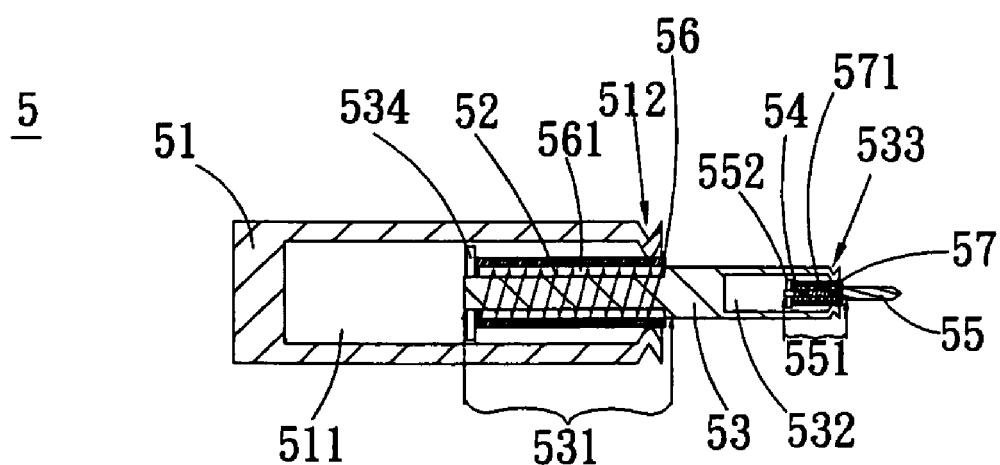

Furthermore, referring to FIGS. 6A and 6B, the testing probe 5 according to another preferred embodiment of the invention further includes a third sleeve 57.

In this embodiment, the third sleeve 57 is inserted into and fixed to the second containing portion 532, and has a second through hole 571. The second movable rod 55 passes through the second through hole 571, and the second stopper portion 551 is fully or partially located outside the third sleeve 57. The third sleeve 57 is fixed to the inside of the second containing portion 532 through the second neck 533 of the first movable rod 53.

As shown in FIG. 6A, the second springy component 54 is located inside the second containing portion 532 and adjacent to the third sleeve 57. The second stopper portion 551 is located outside the third sleeve 57 so as to contact the second springy component 54.

In addition, as shown in FIG. 6B, the second springy component 54 is located inside the second containing portion 532 and is positioned within the second through hole 571. In this case, the second movable rod 55 further passes through the second springy component 54 and the second stopper portion 551 is partially located outside the third sleeve 57. In addition, a C-ring 552 located outside the third sleeve 57 is utilized to restrict one part of the second movable rod 55 in the third sleeve 57.

It is to be noted that the position of the first springy component 52 and the position of the second springy component 54 may be optionally configured. For example, the first springy component 52 may be located outside the second sleeve 56 while the second springy component 54 may be located inside the second through hole 571 of the third sleeve 57; the first springy component 52 is located inside the first through hole 561 of the second sleeve 56 while the second springy component 54 is located outside the third sleeve 57; or the first springy component 52 is located inside the first through hole 561 of the second sleeve 56 while the second springy component 54 is located inside the second through hole 571 of the third sleeve 57.

As described above, the testing probe according to the preferred embodiment of the invention utilizes the second sleeve 56 and the third sleeve 57 to intensify its intensity, thereby effectively avoiding the situation of broken probe or bent probe.

Figure 7:
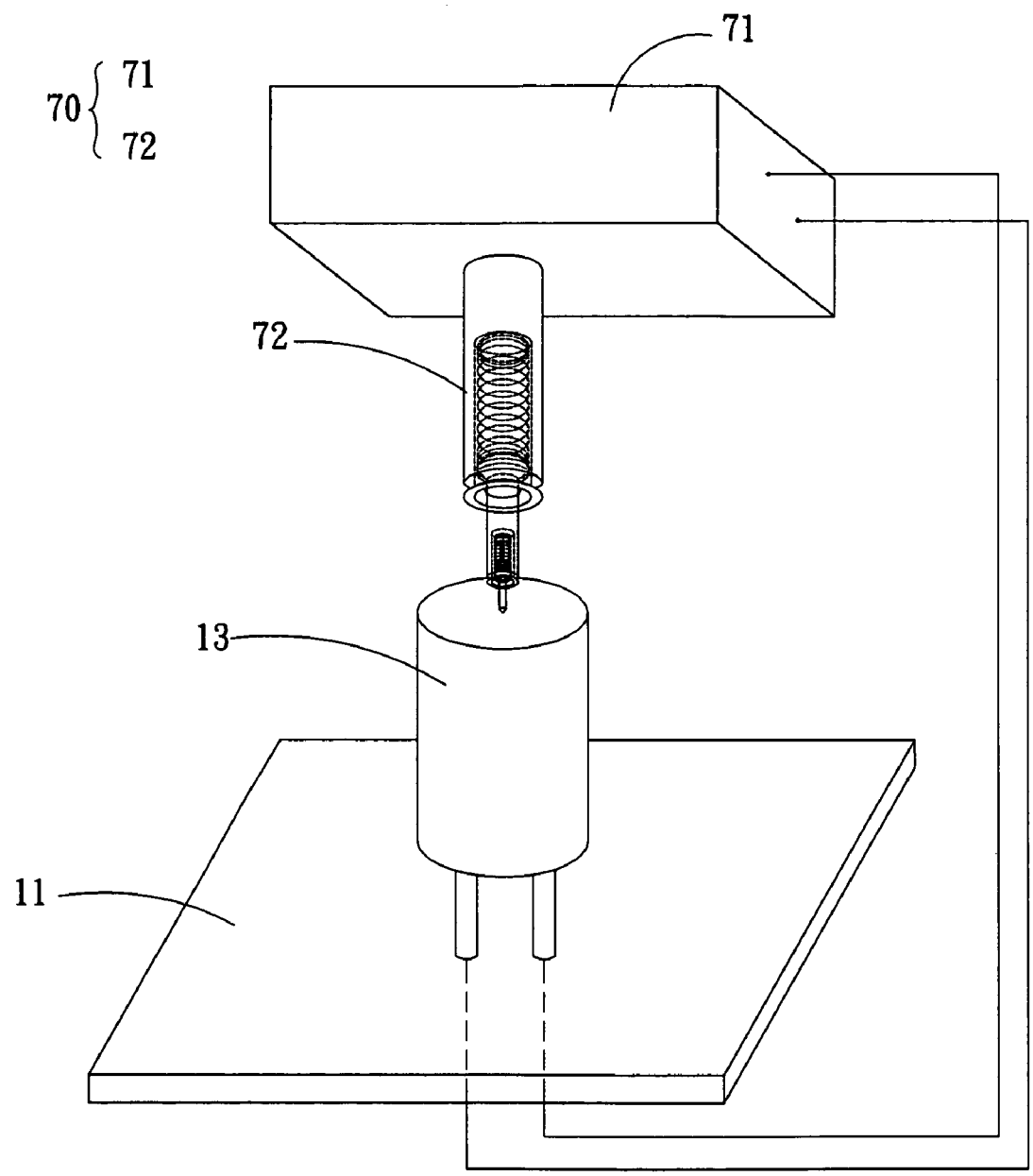
FIG. 7 is a schematic illustration showing the testing jig according to the preferred embodiment of the invention.

In addition, as shown in FIG. 7, a testing jig 70 according to the preferred embodiment of the invention is for testing an electrolytic capacitor 13, and more particularly an electrolytic capacitor 13 provided inside a circuit board 11. Referring to FIG. 7, the testing jig 70 includes a base 71 and at least one testing probe 72 connected to the base 71.

In this embodiment, the testing probe 72 is the testing probe 4 or the testing probe 5, as shown in FIGS. 4 to 6B, so the detailed descriptions are omitted here for concise purpose. It is to be noted that the first sleeve of the testing probe 72 of this embodiment further has a connection portion for connecting the testing probe 72 to the base 71.

As mentioned above, since the testing probe of the invention utilizes the relative sliding motion between the first movable rod and the second movable rod to provide a two-stage probe stroke, the probe stroke of the testing probe may be effectively increased. In addition, the testing probe of the invention effectively distributes the sustained stress over the first movable rod and the second movable rod, that is, the stress is dispersed and converted into the potentials of the first and second springy components, so the intensity of the testing probe may be effectively enhanced. Furthermore, because the testing jig of the invention has the above-mentioned testing probe, the probe stroke may be increased in conjunction with different heights of the to-be-tested electrolytic capacitors so that the testing cost may be saved. In addition, the probe intensity may be enhanced so that the situations such as the increased costs and error test results caused by the broken or bent testing probe.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A testing probe, comprising:
    a first sleeve having a first containing portion;
    a first springy component located inside the first containing portion;
    a first movable rod, which is at least partially inserted into the first containing portion and has a first stopper portion and a second containing portion, wherein the first stopper portion is located inside the first containing portion of the first sleeve, and the first movable rod and the first containing portion are relatively sliding;
    a second springy component located inside the second containing portion;
    at least one second movable rod, which is at least partially inserted into the second containing portion and has a second stopper portion, wherein the second stopper portion is located inside the second containing portion of the first movable rod, and the second movable rod and the second containing portion are relatively sliding; and
    a second sleeve inserted into and fixed to the first containing portion, wherein the second sleeve has a first through hole, the first movable rod passes through the first through hole, and at least one part of the first stopper portion is located outside the second sleeve.

2. The testing probe according to claim 1, wherein the first containing portion further comprises a first neck.

3. The testing probe according to claim 1, wherein the first springy component is inside the first through hole, and the first movable rod further passes through the first springy component.

4. The testing probe according to claim 1, wherein the first stopper portion further comprises a C-ring located outside the second sleeve.

5. The testing probe according to claim 1, wherein the second containing portion further comprises a second neck.

6. The testing probe according to claim 1, further comprising a third sleeve inserted into and fixed to the second containing portion, wherein the third sleeve has a second through hole, the second movable rod passes through the second through hole, and at least one part of the second stopper portion is located outside the third sleeve.

7. The testing probe according to claim 6, wherein the second springy component is located inside the second through hole, and the second movable rod further passes through the second springy component.

8. The testing probe according to claim 6, wherein the second stopper portion is a C-ring located outside the third sleeve.

9. A testing jig for testing an electrolytic capacitor, comprising:
    a base; and
    a testing probe, which comprises:
        a first sleeve, which has a first containing portion and is connected to the base,
        a first springy component located inside the first containing portion,
        a first movable rod, which is at least partially inserted into the first containing portion and has a first stopper portion and a second containing portion, wherein the first stopper portion is located inside the first containing portion of the first sleeve, and the first movable rod and the first containing portion are capable of relatively sliding,
        a second springy component located inside the second containing portion, at least one second movable rod, which is at least partially inserted into the second containing portion and has a second stopper portion, wherein the second stopper portion is located inside the first containing portion of the first movable rod, and the second movable rod and the second containing portion are capable of relatively sliding, and a second sleeve inserted into and fixed to the first containing portion, wherein the second sleeve has a first through hole, the first movable rod passes through the first through hole, and at least one part of the first stopper portion is located outside the second sleeve.

10. The testing jig according to claim 9, wherein the first containing portion further comprises a first neck.

11. The testing jig according to claim 9, wherein the first springy component is located inside the first through hole.

12. The testing jig according to claim 9, wherein the first stopper portion further comprises a C-ring located outside the second sleeve.

13. The testing jig according to claim 9, wherein the second containing portion further comprises a second neck.

14. The testing jig according to claim 9, further comprising a third sleeve inserted into and fixed to the second containing portion, wherein the third sleeve has a second through hole, the second movable rod passes through the second through hole, and at least one part of the second stopper portion is located outside the third sleeve.

15. The testing jig according to claim 14, wherein the second springy component is located inside the second through hole.

16. The testing jig according to claim 14, wherein the second stopper portion is a C-ring located outside the third sleeve.

17. The testing jig according to claim 9, wherein the first sleeve further comprises a connection portion for connecting the first sleeve to the base.

* * * * *